United States Patent [19]

Faktor et al.

[11] 4,194,954
[45] Mar. 25, 1980

[54] ELECTROLYTIC ETCH PREPARATION OF SEMICONDUCTOR SURFACES

[75] Inventors: Marc M. Faktor, Hertfordshire; John L. Stevenson, Suffolk, both of England

[73] Assignee: The Post Office, London, England

[21] Appl. No.: 884,388

[22] Filed: Mar. 8, 1978

[30] Foreign Application Priority Data

Mar. 11, 1977 [GB] United Kingdom ............... 10455/77

[51] Int. Cl.² ............................................. C25F 3/12
[52] U.S. Cl. .............................. 204/129.3; 204/129.75
[58] Field of Search ........... 204/129.75, 129.8, 129.85, 204/129.9, 129.95, 56 R, 129.3

[56] References Cited

U.S. PATENT DOCUMENTS

| | | | |
|---|---|---|---|
| 3,010,885 | 11/1961 | Schink | 204/129.3 X |
| 3,798,139 | 3/1974 | Schwartz | 204/56 R |
| 3,929,589 | 12/1975 | Ermanis et al. | 204/56 R X |
| 4,006,047 | 2/1977 | Aboaf et al. | 204/129.3 X |
| 4,026,741 | 5/1977 | Chang et al. | 204/56 R X |

FOREIGN PATENT DOCUMENTS 249127  5/1964  Netherlands ...................... 204/129.75

Primary Examiner—John H. Mack
Assistant Examiner—D. R. Valentine
Attorney, Agent, or Firm—Kemon and Estabrook

[57] ABSTRACT

The surface of a semiconductor is prepared by electrolytically removing the surface of the semiconductor. A two component electrolyte is used. A first component forms an oxide on the surface of the semiconductor and the second component dissolves the oxide.

12 Claims, 1 Drawing Figure

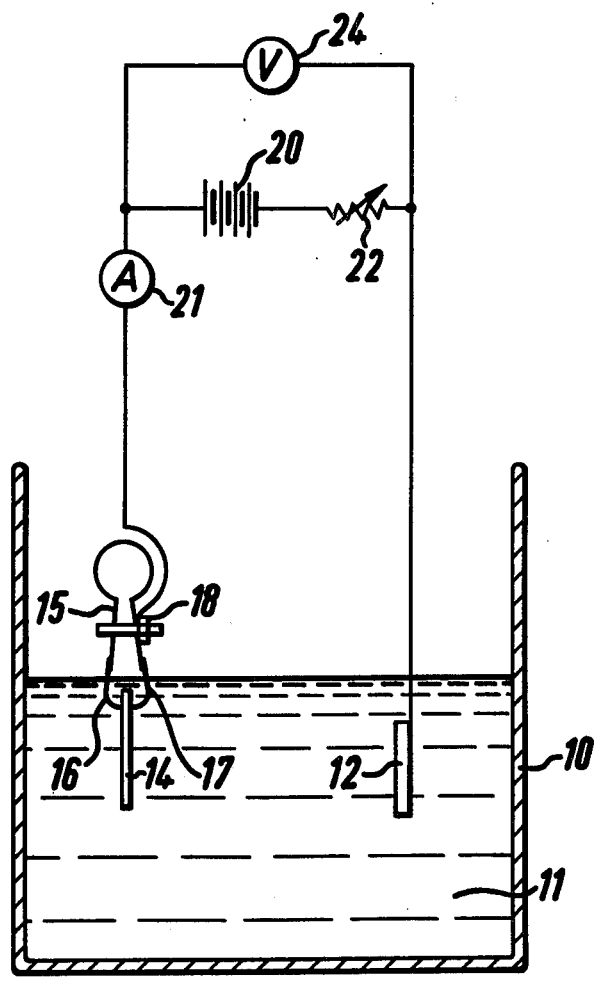

ELECTROLYTIC ETCH PREPARATION OF SEMICONDUCTOR SURFACES

This invention relates to the preparation of semiconductor surfaces. The invention has particular application to the preparation of GaAs surfaces.

Conventional techniques for preparing semiconductor surfaces such as GaAs substrates often involve mechanical or chemo-mechanical polishing. The flatness of substrate surfaces prepared by these methods is poor and the polishing can produce scratch markings on the surface. In addition conventional electrochemical etching techniques which are used for thickness trimming of GaAs epitaxial layers and in which a Schottky barrier is taken to reverse bias breakdown to provide a uniform hole current, employ electrolytes which give anodic products which are virtually insoluble. This results in the formation of a barrier oxide layer which restricts the depth of dissolution which can be obtained.

We have developed an electrolytic etching technique for preparing the surface of a semiconductor which allows continuous dissolution and yields a relatively smooth surface. The technique uses a two component electrolyte, a first component of which forms an oxide layer on the surface of the semiconductor being prepared and the second component of which dissolves the oxide layer.

According to a first aspect of the present invention there is provided a method of preparing a surface of a semiconductor which comprises electrolytically removing material from the surface of the semiconductor using a two component electrolyte, a first component of which forms an oxide layer on the surface of the semiconductor and the second component of which dissolves the oxide.

The second component should be capable of forming oxide complexes with the semiconductor in aqueous solution, or be able to remove the oxide in some other manner.

In one example of the method the surface of gallium arsenide (n-type) is prepared using an electrolyte consisting of sodium dihydrogen orthophosphate as the first component and tiron as the second component. The proportion of tiron is preferably 20% or less by volume.

The method may be started using the first component alone and the second component is added subsequently. Alternatively the two components may be mixed prior to electrolytic action being commenced.

According to a second aspect of the present invention there is provided an electrolyte for use in the method of the first aspect, the electrolyte comprising two components one of which can form an oxide layer on the surface of the semiconductor to be prepared, and the other of which can dissolve the oxide.

The first component may be one of sodium dihydrogen orthophosphate, disodium tetraborate and potassium dihydrogen arsenate, and the second component is one of tiron and ethanolamine.

A third aspect of the present invention provides semiconductors particularly gallium arsenide when prepared by the method of the first aspect.

BRIEF DESCRIPTION OF THE DRAWING

The FIGURE is a schematic illustration of an electrolytic cell for carrying out the method.

The invention will be described now by way of example only with reference to the accompanying drawing.

The present method is for etching a semiconductor surface to provide a smooth surface on a single crystal slice at a predetermined thickness. The method employs an electrolytic etch technique using a two component electrolyte and can be carried out in any suitable electrolytic cell. The two component electrolyte has a first component or film former which forms an oxide film or layer on the surface of the semiconductor being prepared and a second component or film dissolver which dissolves the oxide layer formed. The method can be applied to any semiconductor in which oxides of the semiconductor are capable of conversion to complexes in aqueous solution by the use of complexant electrolytes. Examples of semiconductors meeting this requirement are InSb, GaAs and InAs.

An advantage of the present method lies in the fact that the oxide layer formed is amorphous and thus acts as a buffer between the surface of the semiconductor and the point at which material is removed. The etching process thus becomes defect independent which can be of importance. It is important that the rate of dissolution of the oxide is not so great that an oxide film is not formed. The voltage is applied in the electrolyte between the semiconductor acting as an anode and any suitable inert cathode.

In an example, the method has been used to prepare the surface of gallium arsenide semiconductors. The two components of the electrolyte used in the method are (1) 0.5M Tiron (1,2 dihydroxybenzene-3,5-disulphonic acid disodium salt)

(2) 0.3M Sodium dihydrogen orthophosphate

The sodium dihydrogen orthophosphate acts as the oxide film former whilst the tiron acts as the film remover dissolving the oxide layer formed.

We have found that we can obtain uniform film growth and uniform dissolution of the oxide film with good stability when the voltage applied to the cell is in the range 25–50 volts and the gallium arsenide material is n-type material doped with between $10^{15}$ and $10^{18}$ carriers $cm^{-3}$. No pretreatment of the gallium arsenide slice was necessary before application of a bias voltage which led to nucleation, growth and continuous dissolution of the oxide layer.

A cell in which the method can be carried out is shown in the FIGURE. The cell comprises a suitable container 10 containing the electrolyte 11. An electrode 12 is immersed in the electrolyte and the semiconductor 14 to be treated is immersed in the electrolyte at a position spaced from the electrode 12. The semiconductor 14 is held by means of a pair of caliper tweezers 15 the legs of which carry a pair of aluminium feet 16, 17. The feet 16, 17 are biased into contact with the semiconductor by adjusting a nut 18. The feet 16, 17 which are partially immersed, have to be pre-anodised in the oxide forming electrolyte alone to a residual current level of no more than 30 μA.

Current is provided by a battery 20 which is connected in series with an ammeter 21 and variable resistor 22 across the electrode 12 and semiconductor 14. A voltmeter 24 is connected in parallel with the battery 20 and resistor 22.

A number of electrolyte compositions have been investigated ranging from 50% tiron, 50% sodium dihydrogen orthophosphate to 100% sodium dihydrogen orthophosphate. All these investigations were carried out illuminating the surface being etched. The electric current was monitored so that the thickness of material etched could be determined. These investigations show that increasing proportions of tiron lead to larger steady state etching currents. However establishment of steady state conditions appears to be independent of electrolyte composition, indicating that the initial film growth sequence is dominated by the action of the phosphate anion alone.

The uniform film growth appears to be sensitive to both heating and stirring of the electrolyte. Stirring during dissolution appears to have only a small effect on the etching rate. However, the dependence of the dissolution current on stirring is itself sharply dependent on the electrolyte composition in this case. The reason for this is not properly understood. It is however, advantageous to stir the electrolyte solution gently during dissolution to maintain a clean electrode surface.

The investigations with electrolytes of different compositions have shown that electrolytes having greater than 20% volume proportion of tiron yield semiconductor surfaces which are irregular with a shallow stipple. At a mixing ratio (by volume) of 15% tiron to 85% sodium dihydrogen orthophosphate the steady state dissolution current (i.e. that which gives even dissolution of the GaAs) is 0.7 mA cm$^{-2}$ which corresponds to a removal rate of 1.2 μm per hour.

We have found that the present method can be used to remove scratch markings associated with accidental abrasion of the surface of gallium arsenide during its initial preparation. Removal of approximately 0.5 μm gives a surface devoid of real surface damage, where the original surface was polished chemo-mechanically.

The best surface finish (i.e. that free from microroughness induced during anodisation) appears to be obtained by using constant current rather than constant voltage conditions. The application of between 25 and 50 volts to the cell will produce a large current at the start of anodisation and this current then decays to the steady state value as the oxide layer forms. In order to prevent this large current surge the current limiting resistor 22 (see FIGURE) is included in the circuit of the cell to reduce the maximum current to ~2 mA cm$^{-2}$. Whilst this does not give true constant current conditions the control is such as to provide sub-breakdown voltages at the beginning of the preparation.

An alternative method of starting the anodisation and protection of the surface against initial featuring is to use the oxide former electrolyte alone at the start. This builds up an oxide film on the surface at close to constant current conditions. A small proportion by volume—15%—of tiron electrolyte is then added and the mixture stirred with a consequent increase in the steady state dissolution current.

In addition to the two electrolytes mentioned above the following electrolytes can also be used.

Ethanolamine as an oxide removing complexant electrolyte.

Disodium tetraborate ($Na_2B_4O_7$) and potassium dihydrogen arsenate ($KH_2As\ O_4$) as oxide forming passivating electrolytes. Any combination of the electrolytes can be used.

We claim:

1. A method of preparing a surface of a semiconductor by etching with a two-component electrolyte comprising:
   immersing a semiconductor and a spaced electrode in a two component non-aqueous electrolyte and establishing a potential between said semiconductor and said electrode;
   forming an oxide coating on the semiconductor with a first component of the electrolyte; and
   dissolving said oxide coating with the second component of the electrolyte.

2. A method as claimed in claim 1 wherein said electrolyte comprises sodium dihydrogen orthophosphate as the first component and tiron as the second component.

3. A method as claimed in claim 2 wherein the semiconductor is gallium arsenide.

4. A method as claimed in claim 2 wherein the proportion of tiron is less than or equal to 20% by volume.

5. A method as claimed in claim 4 wherein the proportion of tiron is approximately 15% and the proportion of sodium dihydrogen orthophosphate is approximately 85%.

6. A method as claimed in claim 1 wherein the method is started with said first component alone and the second component is added subsequently.

7. A method as claimed in claim 1 wherein the two components are mixed prior to electrolytic action being commenced.

8. A method as claimed in claim 1 wherein the first component is one of sodium dihydrogen orthophosphate, disodium tetraborate and potassium dihydrogen arsenate and the second component is one of tiron and ethanolamine.

9. An electrolyte for use in the method as claimed in claim 1 said electrolyte comprising two components, one of which can form an oxide layer on the surface of the semiconductor to be prepared, and the other of which can dissolve the oxide.

10. An electrolyte as claimed in claim 9 wherein the proportion of the second component is 20% or less by volume.

11. An electrolyte as claimed in claim 9 wherein the first component is one of sodium dihydrogen orthophosphate, disodium tetraborate and potassium dihydrogen arsenate and the second component is one of tiron and ethanolamine.

12. An electrolyte as claimed in claim 9 wherein the first component is approximately 85% by volume sodium dihydrogen orthophosphate and the second component is approximately 15% by volume tiron.

* * * * *